United States Patent
Soininen et al.

(10) Patent No.: US 12,104,248 B2
(45) Date of Patent: Oct. 1, 2024

(54) GAS FEEDING CUP AND A GAS MANIFOLD ASSEMBLY

(71) Applicant: BENEQ OY, Espoo (FI)

(72) Inventors: Pekka Soininen, Espoo (FI); Johannes Wesslin, Espoo (FI); Jonas Andersson, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 18/475,338

(22) Filed: Sep. 27, 2023

(65) Prior Publication Data

US 2024/0018651 A1 Jan. 18, 2024

Related U.S. Application Data

(63) Continuation of application No. PCT/FI2022/050201, filed on Mar. 29, 2022.

(30) Foreign Application Priority Data

Mar. 30, 2021 (FI) .................................. 20215375

(51) Int. Cl.
    *C23C 16/455* (2006.01)
(52) U.S. Cl.
    CPC .. *C23C 16/45544* (2013.01); *C23C 16/45561* (2013.01); *C23C 16/45563* (2013.01)
(58) Field of Classification Search
    CPC ........ C23C 16/45544; C23C 16/45561; C23C 16/45563
    See application file for complete search history.

(56) References Cited

U.S. PATENT DOCUMENTS

| | | | |
|---|---|---|---|
| 2002/0076491 A1* | 6/2002 | Delperier | C23C 16/26 427/248.1 |
| 2003/0159653 A1 | 8/2003 | Dando et al. | |
| 2011/0162580 A1 | 7/2011 | Provencher et al. | |
| 2018/0265979 A1 | 9/2018 | Spath et al. | |

(Continued)

FOREIGN PATENT DOCUMENTS

| | | |
|---|---|---|
| JP | 2010087231 A | 4/2010 |
| WO | 2016135377 A1 | 9/2016 |
| WO | WO2019/237820 * | 12/2019 |

OTHER PUBLICATIONS

International Search Report issued by the Finnish Patent and Registration Office acting as the International Searching Authority in relation to International Application No. PCT/FI2022/050201 dated Jul. 1, 2022 (4 pages).

(Continued)

*Primary Examiner* — Joseph A Miller, Jr.
(74) *Attorney, Agent, or Firm* — Robert P. Michal, Esq.; Carter, DeLuca & Farrell LLP

(57) ABSTRACT

A gas feeding cup removably provided in a fixed gas manifold structure of an atomic layer deposition apparatus and including a cup bottom including gas feeding channels extending through the cup bottom from a cup bottom outer surface to a cup bottom inner surface on the other side of the cup bottom; and a cup wall surrounding the cup bottom and extending transverse relative to the cup bottom in a direction away from the cup bottom at the inner surface side of the cup bottom such that a gas feeding space is formed by the cup wall and the cup bottom inner surface.

19 Claims, 5 Drawing Sheets

(56) References Cited

U.S. PATENT DOCUMENTS

2019/0360095 A1  11/2019  Dip
2021/0332478 A1* 10/2021  Chen ................. C23C 16/45544

OTHER PUBLICATIONS

Written Opinion of the International Searching Authority issued by the Finnish Patent and Registration Office acting as the International Searching Authority in relation to International Application No. PCT/FI2022/050201 dated Jul. 1, 2022 (6 pages).
Finnish Search Report issued by the Finnish Patent and Registration Office in relation to Finnish Application No. 20215375 dated Oct. 28, 2021 (1 page).

* cited by examiner

GAS FEEDING CUP AND A GAS MANIFOLD ASSEMBLY

CROSS-REFERENCE TO RELATED APPLICATIONS

This application is a continuation of PCT International Application No. PCT/FI2022/050201 filed Mar. 29, 2022, which claims priority to Finnish Patent Application No. 20215375, filed Mar. 30, 2021, the disclosure of each of these applications is expressly incorporated herein by reference in their entirety.

FIELD OF THE INVENTION

The present invention relates to a gas feeding cup.

The present invention further relates to a gas manifold assembly.

BACKGROUND OF THE INVENTION

The present invention relates to an atomic layer deposition (ALD) apparatus in which during an atomic layer deposition a film is grown on a substrate by exposing its surface to alternate gaseous precursors. When these gaseous precursors are exposed on a surface they react and form a film on the surface. The parts where the film growth occur has to be removed for cleaning in a frequent base. The film growth starts from a mixing point in which the gases meet each other and are mixed. This point may be for example in a mixing tube or some other part in the atomic layer deposition apparatus. This part and any other part from this mixing point to the pump line has to be removed for cleaning. The parts are typically difficult to remove and whole apparatus has to be cooled to make possible for an operator to open the connections and reach the parts which have cleaned. Slow cooling and heating of this size of an apparatus takes time which is out of production time.

BRIEF DESCRIPTION OF THE INVENTION

An object of the present invention is to provide an easily accessible and removable mixing point in which the gaseous precursors meet for the first time.

The objects of the invention are achieved by a gas feeding cup and a gas manifold assembly which are characterized by what is stated in the independent claims. The preferred embodiments of the invention are disclosed in the dependent claims.

The invention is based on the idea of providing a removable and compact mixing part in which the precursor gases meet for the first time and which can be taken off from the atomic layer deposition apparatus and replaced for a clean one in order to save the process time and for minimizing the maintenance time of the atomic layer deposition apparatus.

A gas feeding cup according to the invention is removably provided in a fixed gas manifold structure of an atomic layer deposition apparatus. The fixed gas manifold structure provides gas channels from the gas sources for the atomic layer deposition apparatus. The gas feeding cup is provided in connection with the fixed gas manifold structure prior a reaction chamber into which the gases are supplied. The gas feeding cup comprises a cup bottom and a cup wall. The cup bottom comprises gas feeding channels extending through the cup bottom from a cup bottom outer surface to a cup bottom inner surface on the other side of the cup bottom and the cup wall surrounding the cup bottom and extending transverse relative to the cup bottom in a direction away from the cup bottom at the inner surface side of the cup bottom such that a gas feeding space is formed by the cup wall and the cup bottom inner surface. The cup wall further extending at least partly in a direction away from the cup bottom at the outer surface side of the cup bottom such that a flange is formed on the opposite side of the cup bottom than the gas feeding space.

The gas feeding cup is preferably a circumferential cup with a cylindrical outer surface. The flange may have additional forms, or the cylindrical surface may lack portions to provide attachment structure to the fixed gas manifold structure.

According to the invention at least one of the gas feeding channels form a conical shape through the cup bottom such that an inlet opening of the gas feeding channel at the cup bottom outer surface is smaller than an outlet opening of the gas feeding channel at the cup bottom inner surface. The gas feeding channel having the conical shape is preferably provided in a mid-section of the cup bottom or in the centre of the cup bottom.

According to the invention the flange comprises an alignment section arranged to connect to a counter section in the fixed gas manifold structure for aligning the gas feeding cup so that the gas feeding channels align with the respective gas feeding channels of the fixed gas manifold structure.

The alignment section is preferably provided to the flange as a protrusion so as to form a point of discontinuity on an otherwise symmetrical flange. Alternatively, the flange is not symmetrical, and the alignment section forms a alignment portion with which the feeding cup is placed correctly to the fixed gas manifold structure.

According to the invention the gas feeding cup comprises a gas homogenisation surface arranged to the gas feeding space, said gas homogenisation surface is arranged at a distance from the cup bottom inner surface and at least partly parallel to the cup bottom inner surface for forming a gas homogenisation zone between the cup bottom inner surface and the gas homogenisation surface.

The gas homogenisation surface is preferably provided at least partly opposite to the gas feeding channels arranged at the cup bottom. The gas homogenisation surface may be a plate connected to the cup wall or to the cup bottom. The plate may be in a form of an arc providing a flowing path for the gases at the centre the gas feeding cup. Alternatively, the plate may be provided to the centre of the gas feeding space parallel to the cup bottom and providing a flowing path for the gases between the edge of the plate and the cup wall. Alternatively, the gas homogenisation surface may provide a flowing path for the gases between the cup wall and the homogenisation surface and at the centre of the gas feeding space.

According to the invention the gas homogenisation surface comprises a passage from the gas homogenisation zone through the homogenisation surface to the gas feeding space outside the gas homogenisation zone for allowing gases to flow from the gas feeding channels through the gas homogenisation zone to the gas feeding space outside the gas homogenisation zone. The passage at the gas homogenisation surface provides a flowing path for the gases.

According to the invention the gas feeding cup further comprises a gas mixing cone arranged to the gas feeding space, said gas mixing cone is arranged at a distance from the cup bottom inner surface for forming a gas mixing zone between the cup bottom inner surface and the gas mixing cone. The gas mixing cone may be connected to the cup bottom or to the cup wall.

According to the invention the gas mixing cone is arranged to the gas feeding space such that an apex of the gas mixing cone is furthest away from the cup bottom inner surface, and a gas flowing zone is provided between the gas mixing cone and the cup wall by arranging the gas mixing cone at a distance from the cup wall for providing a flowing path from the gas mixing zone to the gas feeding space outside the gas mixing zone. Alternatively, the gas mixing cone may comprise an aperture at the top of the cone for providing a gas flowing path from the gas mixing zone to the gas feeding space outside the gas mixing zone.

According to the invention the gas feeding cup further comprises a gas mixing cone arranged to the gas feeding space, said gas mixing cone is arranged at a distance from the gas homogenisation surface for forming a gas mixing zone between the gas homogenisation surface and the gas mixing cone. The gas mixing cone may be connected to the gas homogenisation surface, or alternatively, or in addition to the cup wall, or alternatively or in addition to the cup bottom.

According to the invention the gas mixing cone is arranged to the gas feeding space such that an apex of the gas mixing cone is furthest away from the gas homogenisation surface, and a gas flowing zone is provided between the gas mixing cone and the cup wall by arranging the gas mixing cone at a distance from the cup wall for providing a flowing path from the gas mixing zone to the gas feeding space outside the gas mixing zone.

According to an alternative embodiment of the invention the gas mixing cone is arranged to the gas feeding space such that the apex of the gas mixing cone is closest to the gas homogenisation surface, and the gas flowing zone is provided between the gas mixing cone and the cup wall by arranging the gas mixing cone at a distance from the cup wall for providing a flowing path from the gas mixing zone to the gas feeding space outside the gas mixing zone.

According to the invention the gas mixing cone can be replaced by a gas mixing concave surface or a gas mixing curved surface.

A gas manifold assembly of an atomic layer deposition apparatus according to the invention comprises a gas manifold structure, a gas feeding cup releasably arranged in connection with the gas manifold structure and a gas guiding structure in connection with the gas manifold structure. The gas manifold structure is provided to the atomic layer deposition apparatus as a fixed part of the atomic layer deposition apparatus. The gas manifold structure comprising gas feeding channels extending from gas sources to a manifold surface. The gas feeding cup having a cup bottom and comprising gas feeding channels extending through the cup bottom from a cup bottom outer surface to a cup bottom inner surface on the other side of the cup bottom. The gas feeding cup being releasably arranged in connection with the gas manifold structure such that the cup bottom outer surface is arranged against the manifold surface, and the gas feeding channels of the gas feeding cup are aligned with the respective gas feeding channels of the gas manifold structure for forming continuous gas feeding channels. The gas guiding structure extending between the gas manifold structure and a reaction chamber of the atomic layer deposition apparatus. The gas guiding structure is arranged to guide gases from the gas sources through the gas feeding channels of the gas manifold structure and further through the gas feeding channels of the gas feeding cup to the reaction chamber of the atomic layer deposition apparatus.

According to the invention the gas feeding cup being positioned to the gas manifold structure by using gravity, and the gas feeding channels of the gas feeding cup are aligned with the gas feeding channels of the gas manifold structure by an alignment structure. The gas feeding cup is placed in connection with the gas manifold structure and connected to the gas manifold structure by gravity without any other components. When the gas feeding cup is removed for cleaning, the gas feeding cup is simply lifted out of the gas manifold structure.

According to the invention the alignment structure comprises an alignment section in the gas feeding cup arranged to connect to a counter section in the fixed gas manifold structure for aligning the gas feeding channels of the gas feeding cup with the respective gas feeding channels of the gas manifold structure.

According to the invention the alignment section is arranged in connection with the flange of the gas feeding cup.

According to the invention the gas feeding cup as described in various embodiments can be used in the gas manifold assembly as above described.

An advantage of the invention is that the film growth of the reacting precursor gases is limited only to an easily gas feeding cup. The gas feeding cup can be removed from the atomic layer deposition apparatus after every run. The gas feeding cup is located on the fixed gas manifold structure, and the position of the gas feeding cup is locked so that the gas feeding channels at the gas feeding cup and at the gas manifold structure meet each other. The locking of the gas feeding cup is provided through the cup structure and/or the gas manifold structure without additional components or locking parts.

An advantage of the invention is further that the wall of the gas feeding cup may be as thin as possible because the gas feeding channels are provided to the cup bottom. This saves weight which is advantageous because the gas feeding cup diameter can be about 150 mm-300 mm and the weight may be around 10-20 kg.

The cup is positioned by using gravity so it can be removed via a maintenance door of the atomic layer deposition apparatus just by lifting it up.

With the gas feeding cup of the invention an important cleaning problem is solved because the cleaning can be performed without cooling the reactor of the atomic layer deposition apparatus.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
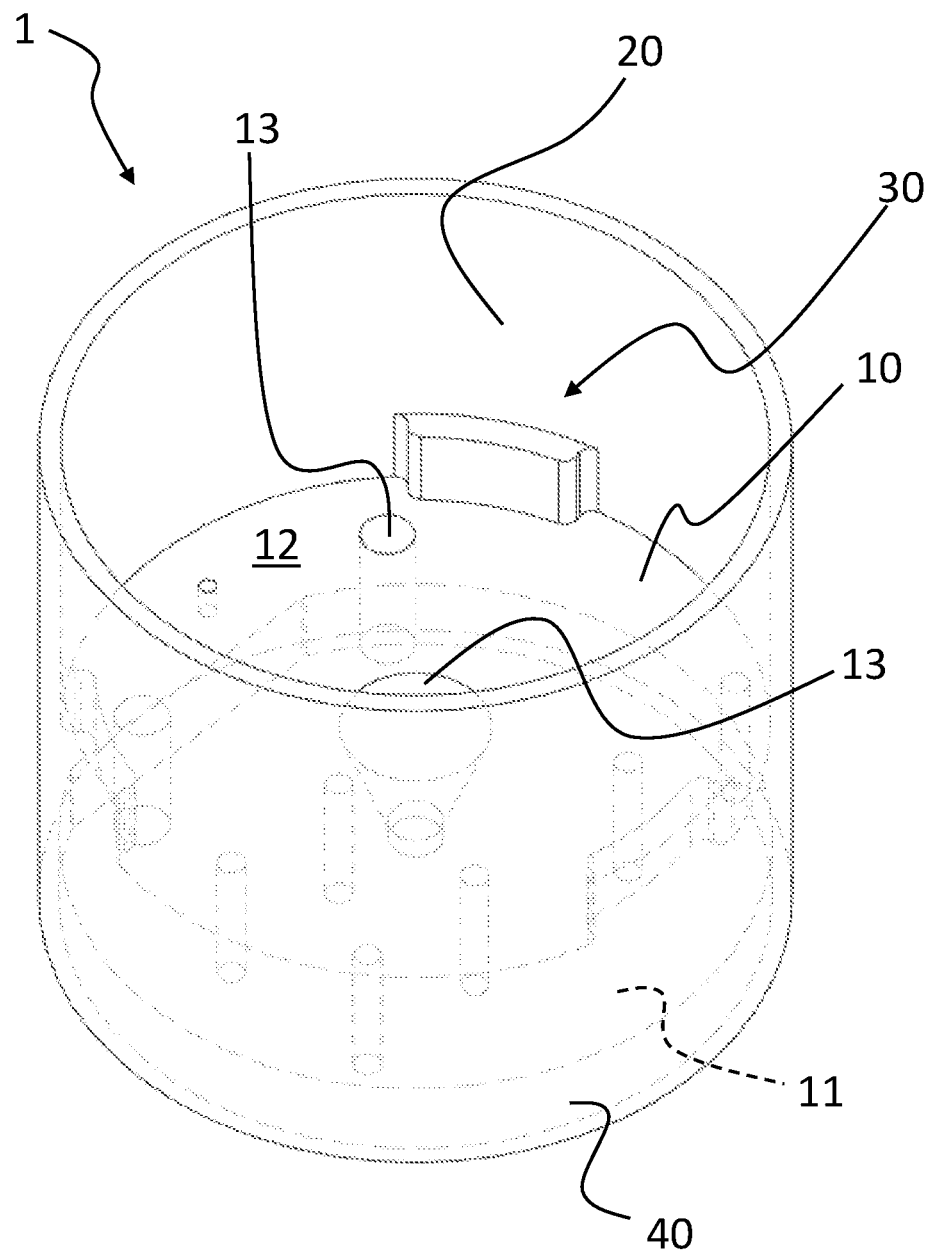
FIG. 1 shows a gas feeding cup according to the invention.

FIG. 1 shows a gas feeding cup 1 according to the invention which comprises a cup bottom 10 and a cup wall 20 surrounding the cup bottom 10. The cup bottom 10 having a cup bottom outer surface 11 and a cup bottom inner surface 12 and gas feeding channels 13 extending through the cup bottom 10 from the cup bottom outer surface 11 to the cup bottom inner surface 12. The cup bottom outer surface 11 is surrounded by a flange 40 protruding from the cup bottom outer surface 11. The cup bottom outer surface 11 is shown with a dashed line because the cup bottom outer surface 11 is actually not as such shown from this perspective. The FIG. 1 shows that the cup wall 20 extends as the flange 40 from the cup bottom outer surface 11 but the flange can be provided to the cup bottom outer surface 11 also such that the cup wall 20 and the flange 40 are separate without forming a continuous outer surface of the gas feeding cup 1. The flange 40 forms together with the cup bottom outer surface 11 a contacting space for the fixed gas manifold structure 2. The contacting space 40a of the gas feeding cup 1 is arranged to receive a manifold base 22 of the fixed gas manifold structure 2 on which the gas feeding cup 1 is connected by gravity. The manifold base 22 comprises a manifold surface 21 contacting the cup bottom outer surface 11. FIG. 1 also shows the gas feeding space 30 formed by the cup wall 20 and the cup bottom inner surface 12. The gas feeding space 30 forming the platform for the precursor gases supplied from the gas feeding channels 13 to meet for the first time.

Figure 2:
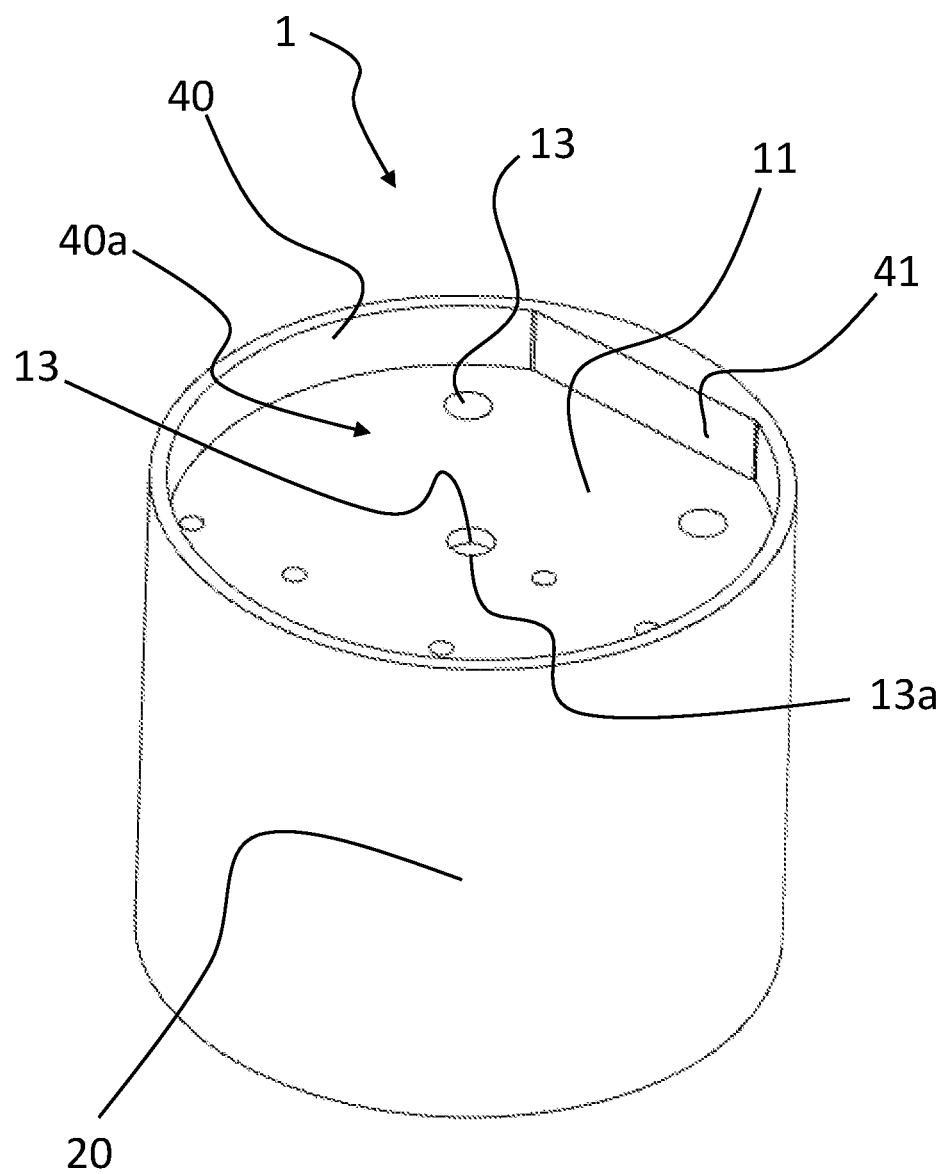
FIG. 2 shows a gas feeding cup according to the invention from its bottom side.

FIG. 2 shows a gas feeding cup 1 according to the invention from its bottom side. The figure shows the cup bottom outer surface 11 which comprises inlet openings 13a to the gas feeding channels 13. The cup wall 20 extends past the cup bottom 10 such that a flange 40 is formed around the cup bottom outer surface 11. The flange 40 comprises an alignment section 41 arranged to connect to a counter section in the fixed gas manifold structure 2 for aligning the gas feeding cup 1 so that the gas feeding channels 13 align with the respective gas feeding channels of the fixed gas manifold structure 2. In this embodiment shown in FIG. 2 the alignment section 41 is a protrusion from the flange 40 towards the contacting space 40a. However, the alignment portion 41 may comprise another shape suitable for positioning the cup bottom outer surface 11 of the gas feeding cup in the correct direction relative to the manifold surface 21 of the fixed gas manifold structure 2.

Figure 3:
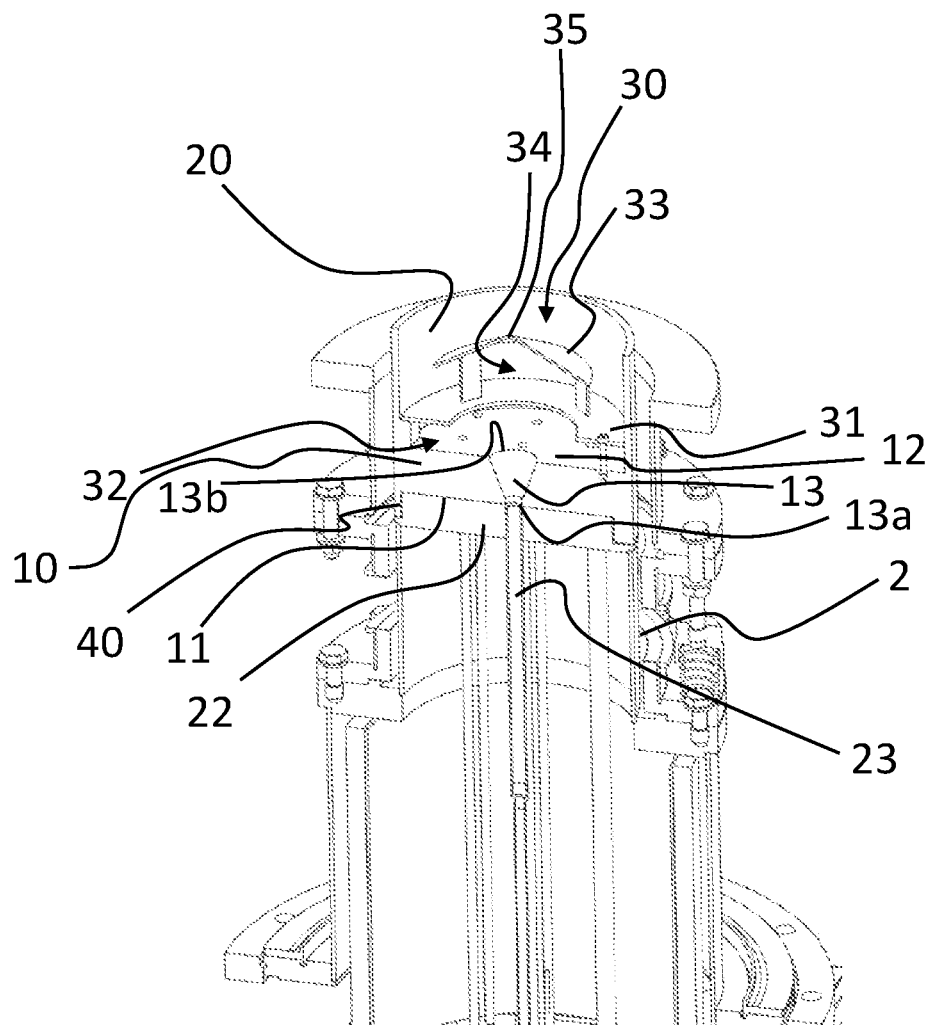
FIG. 3 shows a gas manifold assembly according to the invention.

FIG. 3 shows an embodiment in which the gas feeding space 30 is provided with a gas homogenisation surface 31 and a gas mixing cone 33. The gas homogenisation surface 31 is arranged at a distance from the cup bottom inner surface 12 and at least partly parallel to the cup bottom inner surface 12 for forming a gas homogenisation zone 32 between the cup bottom inner surface 12 and the gas homogenisation surface 31. The gas homogenisation surface 31 is provided at least partly opposite to the gas feeding channels 13 or opposite to at least some of the gas feeding channels 13. The form of the gas homogenisation surface 31 can be of any kind. FIG. 3 shows an embodiment in which the gas homogenization surface 31 is a plate arranged as a circumferential arc according to the cup wall 20 so that an opening remains in the middle.

FIG. 3 also shows the gas mixing cone 33 provided in the gas feeding space 30 such that the gas mixing cone 33 is connected to the plate forming the gas homogenisation surface 31. The gas mixing cone 33 is arranged at a distance from the gas homogenisation surface 31 for forming a gas mixing zone 34 between the gas homogenisation surface 31 and the gas mixing cone 33. The gas mixing cone 33 having an apex 35 which points towards an opening of the gas feeding cup 1. The opening of the gas feeding cup 1 being opposite to the cup bottom inner surface 12 and surrounded by the cup wall 20. The gas mixing cone 33 forms a gas mixing zone 34 between the cup bottom inner surface 11 and the gas mixing cone 33 when there is no gas homogenisation surface 31 or between the gas homogenisation surface 31 and the gas mixing cone 33.

In the gas homogenisation zone 32 the gases coming from the gas feeding channels 13 are homogenized and in the gas mixing zone 36 the gases are mixed prior flowing out from the gas feeding cup 1. The mixing cone 33 and the cup wall 20 provide a flowing path for the gases to flow from the mixing zone 32 to the gas feeding space 30 and further out from the gas feeding cup 1. The gas mixing cone 33 is therefore arranged at a distance from the cup wall 20 for providing the flowing path from the gas mixing zone 34 to the gas feeding space 30 outside the gas mixing zone 34.

FIG. 3 further shows a gas manifold assembly according to the invention in which the gas feeding cup 1 is connected to the gas manifold structure 2 by gravity which means that there is no connecting parts connecting the gas feeding cup 1 and the gas manifold structure 2 together. The gas feeding cup 1 is provided to the gas manifold structure 2 such that the cup bottom outer surface 11 is placed on the manifold surface 21 of the gas manifold structure 2. The gas feeding channels 13 of the gas feeding cup 1 are aligned with the respective gas feeding channels 23 of the gas manifold structure 2 for forming continuous gas feeding channels extending from gas sources (not shown in the figure) through the gas manifold structure 2 via the gas manifold surface 21 and cup bottom outer surface 11 of the gas feeding cup 1 to the gas feeding channels 13 of the gas feeding cup 1 and finally to the gas feeding space 30 within the cup wall 20 of the gas feeding cup 1 until supplied to the reactor of the atomic layer deposition apparatus. The cup wall 20 is surrounded by the gas manifold structure 2 such that there is space provided between the cup wall 20 and the gas manifold structure 2. In the embodiment shown in FIG. 3 one of the gas feeding channels 13 forming a conical shape through the cup bottom 10 such that an inlet opening 13a of the gas feeding channel 13 at the cup bottom outer surface 11 is smaller than an outlet opening 13b of the gas feeding channel 13 at the cup bottom inner surface 12. FIG. 3 also shows that the homogenisation surface 31 is provided to the gas feeding space 30 such that the homogenisation surface 31 is forming connection with the cup wall 20 and the centre part of the gas feeding space 30 is left open for the gases to flow from the homogenisation zone 32 to the gas mixing zone 34, which the gas mixing zone 34 is formed by the gas mixing cone 33. The gas mixing cone 33 is connected in this embodiment to the homogenisation surface 31 and the gas mixing cone 33 surrounds the open centre part of the homogenisation surface 31 such that the gases flowing through the opening enter to the gas mixing cone 33.

The cup bottom 10 is preferably at least three times as thick as the cup wall 20. The thick cup bottom 10 provides an advantage in that the precursor gas coming from the gas feeding channel 13 forms a gas barrier flow preventing film deposition to penetrating into the gas feeding channel 13 so that there will not be any film deposition on the cup bottom outer surface 11.

FIG. 3 also shows that the manifold base 22 comprising the manifold surface 21 is arranged in contact with the cup bottom outer surface 11 such that the gas feeding channels 13 of the gas feeding cup 1 are aligned with the respective gas feeding channels 23 of the gas manifold structure 2 for forming continuous gas feeding channels.

Figure 4:
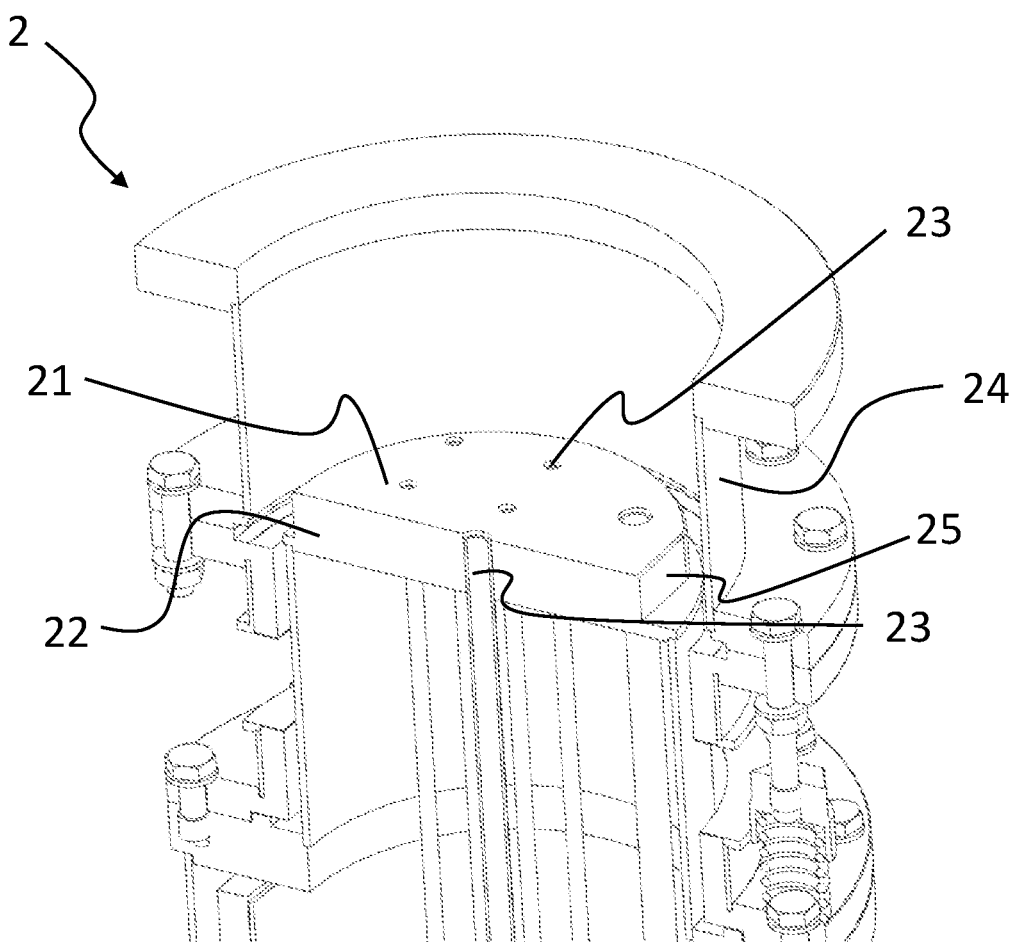
FIG. 4 shows a fixed gas manifold structure of the gas manifold assembly according to the invention.

FIG. 4 shows a fixed gas manifold structure 2 of the gas manifold assembly according to the invention in which the fixed gas manifold structure 2 further comprises a sealing flange 24 connected to the fixed gas manifold structure 2. The sealing flange 24 is arranged to form together with the cup wall 20 of the gas feeding cup 1 a coaxial opening between an outer wall of the gas feeding cup 1 and the inner wall 24a of the sealing flange 24. The coaxial opening is used for feeding inert gas so that there will be gas barrier which prevents film growth outside the gas feeding cup 1. This provides a further advantage in that the gas feeding cup 1 is the only part in which film growth happens when the precursor gases meet for the first time and which can be easily removed from the atomic layer deposition apparatus.

The FIG. 4 also shows the manifold surface 21 onto which the gas feeding cup 1 is placed such that the cup bottom outer surface 11 is placed against the manifold surface 21 such that the gas feeding channels 3 of the gas feeding cup 1 align with the respective gas feeding channels 23 of the gas manifold structure 2. The FIG. 4 also shows the alignment section 25 of the gas manifold structure 2 provided to the gas manifold base 22 which corresponds to the alignment section 41 of the gas feeding cup 1.

Figure 5:
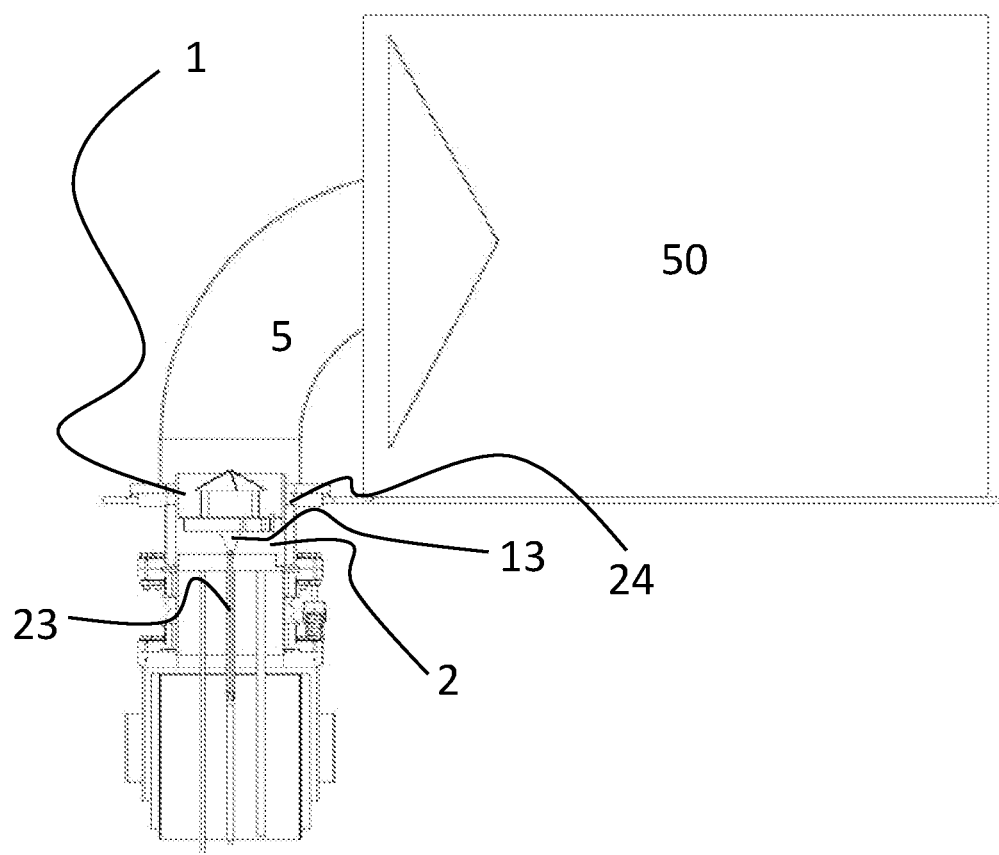
FIG. 5 shows a gas manifold assembly according to the invention.

FIG. 5 shows a gas manifold assembly according to the invention, which comprises a gas manifold structure 2 provided to the atomic layer deposition apparatus as a fixed part of the atomic layer deposition apparatus, a gas feeding cup 2 provided in connection with the gas manifold structure 2 and a gas guiding structure 5 in connection with the gas manifold structure and extending to the reaction chamber 50 of the atomic layer deposition apparatus. The gas manifold structure 2 comprising gas feeding channels 23 extending from gas sources to a manifold surface 21 and further to the gas feeding channels 13 of the gas feeding cup 1 provided to the cup bottom 10 such that the gas feeding channels 13 extend through the cup bottom 10. The gas feeding cup 1 is releasably arranged in connection with the gas manifold structure 2 such that the cup bottom outer surface 11 is arranged against the manifold surface 21 and lie on the gas manifold surface 21. The gas feeding channels 13 of the gas feeding cup 1 are aligned with the respective gas feeding channels 23 of the gas manifold structure 2 for forming continuous gas feeding channels. The gas manifold assembly comprises a gas guiding structure 5 extending between the gas manifold structure 2 and the reaction chamber 50 of the atomic layer deposition apparatus for guiding the gases from the gas feeding cup to the reaction chamber. The gas feeding cup 1 is provided within the sealing flange 24 of the gas manifold structure 2 and the sealing flange 24 is connected to the gas guiding structure 5.

The invention has been described above with reference to the examples shown in the figures. However, the invention is in no way restricted to the above examples but may vary within the scope of the claims.

The invention claimed is:

1. An atomic layer deposition apparatus, comprising:
a fixed gas manifold structure; and
a gas feeding cup removably provided in the fixed gas manifold structure, the gas feeding cup including:
    a cup bottom comprising gas feeding channels extending through the cup bottom from a cup bottom outer surface to a cup bottom inner surface on the other side of the cup bottom;
    a cup wall surrounding the cup bottom and extending transverse relative to the cup bottom in a direction away from the cup bottom at the inner surface side of the cup bottom such that a gas feeding space is formed by the cup wall and the cup bottom inner surface; and
    a gas mixing cone arranged to the gas feeding space, the gas mixing cone is disposed at a distance from the cup bottom inner surface for forming a gas mixing zone between the cup bottom inner surface and the gas mixing cone,
    wherein the cup wall extends at least partly in a direction away from the cup bottom at the outer surface side of the cup bottom such that a flange is formed on the opposite side of the cup bottom than the gas feeding space.

2. The atomic layer deposition apparatus according to claim 1, wherein at least one of the gas feeding channels forms a conical shape through the cup bottom such that an inlet opening of the gas feeding channel at the cup bottom outer surface is smaller than an outlet opening of the gas feeding channel at the cup bottom inner surface.

3. The atomic layer deposition apparatus according to claim 1, wherein the flange comprises an alignment section configured to connect to a counter section in the fixed gas manifold structure for aligning the gas feeding cup so that the gas feeding channels align with the respective gas feeding channels of the fixed gas manifold structure.

4. The atomic layer deposition apparatus according to claim 1, wherein the gas feeding cup comprises a gas homogenisation surface arranged to the gas feeding space, said gas homogenisation surface is disposed at a distance from the cup bottom inner surface and at least partly parallel to the cup bottom inner surface for forming a gas homogenisation zone between the cup bottom inner surface and the gas homogenisation surface.

5. The atomic layer deposition apparatus according to claim 4, wherein the gas homogenisation surface comprises a passage from the gas homogenisation zone through the homogenisation surface to the gas feeding space outside the gas homogenisation zone for allowing gases to flow from the gas feeding channels through the gas homogenisation zone to the gas feeding space outside the gas homogenisation zone.

6. The atomic layer deposition apparatus according to claim 1, wherein the gas mixing cone is arranged to the gas feeding space such that an apex of the gas mixing cone is furthest away from the cup bottom inner surface, and a gas flowing zone is provided between the gas mixing cone and the cup wall by arranging the gas mixing cone at a distance from the cup wall for providing a flowing path from the gas mixing zone to the gas feeding space outside the gas mixing zone.

7. The atomic layer deposition apparatus according to claim 4, wherein the gas mixing cone is disposed at a distance from the gas homogenisation surface for forming a second gas mixing zone between the gas homogenisation surface and the gas mixing cone.

8. The atomic layer deposition apparatus according to claim 7, wherein the gas mixing cone is arranged to the gas feeding space such that an apex of the gas mixing cone is furthest away from the gas homogenisation surface, and a gas flowing zone is disposed between the gas mixing cone and the cup wall by arranging the gas mixing cone at a distance from the cup wall for providing a flowing path from the second gas mixing zone to the gas feeding space outside the second gas mixing zone.

9. A gas manifold assembly for use in an atomic layer deposition apparatus, wherein the gas manifold assembly comprises:
a gas manifold structure comprising gas feeding channels extending from gas sources to a manifold surface;

a gas feeding cup having a cup bottom and comprising gas feeding channels extending through the cup bottom from a cup bottom outer surface to a cup bottom inner surface on the other side of the cup bottom, the gas feeding cup being releasably arranged in connection with the gas manifold structure such that the cup bottom outer surface is arranged against the manifold surface, and the gas feeding channels of the gas feeding cup are aligned with the respective gas feeding channels of the gas manifold structure for forming continuous gas feeding channels; and a gas guiding structure in connection with the gas manifold structure, the gas guiding structure is configured to guide gases from the gas sources through the gas feeding channels of the gas manifold structure and further through the gas feeding channels of the gas feeding cup.

10. The gas manifold assembly according to claim 9, wherein the gas feeding cup being positioned to the gas manifold structure by using gravity, and the gas feeding channels of the gas feeding cup are aligned with the gas feeding channels of the gas manifold structure by an alignment structure.

11. The gas manifold assembly according to claim 10, wherein the alignment structure comprises an alignment section in the gas feeding cup arranged to connect to a counter section in the fixed gas manifold structure for aligning the gas feeding channels of the gas feeding cup with the respective gas feeding channels of the gas manifold structure.

12. The gas manifold assembly according to claim 11, wherein the alignment section is arranged in connection with the flange of the gas feeding cup.

13. A gas feeding cup for use in an atomic layer deposition apparatus, wherein the gas feeding cup comprises:

a cup bottom comprising gas feeding channels extending through the cup bottom from a cup bottom outer surface to a cup bottom inner surface on the other side of the cup bottom;

a cup wall surrounding the cup bottom and extending transverse relative to the cup bottom in a direction away from the cup bottom at the inner surface side of the cup bottom such that a gas feeding space is formed by the cup wall and the cup bottom inner surface; and a gas mixing cone is disposed at a distance from the cup bottom inner surface for forming a gas mixing zone between the cup bottom inner surface and the gas mixing cone, wherein the cup wall extends at least partly in a direction away from the cup bottom at the outer surface side of the cup bottom such that a flange is formed on the opposite side of the cup bottom than the gas feeding space.

14. The gas feeding cup according to claim 13, wherein at least one of the gas feeding channels forms a conical shape through the cup bottom such that an inlet opening of the gas feeding channel at the cup bottom outer surface is smaller than an outlet opening of the gas feeding channel at the cup bottom inner surface.

15. The gas feeding cup according to claim 13, further comprising a gas homogenisation surface arranged to the gas feeding space, the gas homogenisation surface is disposed at a distance from the cup bottom inner surface and at least partly parallel to the cup bottom inner surface for forming a gas homogenisation zone between the cup bottom inner surface and the gas homogenisation surface.

16. The gas feeding cup according to claim 15, wherein the gas homogenisation surface comprises a passage from the gas homogenisation zone through the homogenisation surface to the gas feeding space outside the gas homogenisation zone for allowing gases to flow from the gas feeding channels through the gas homogenisation zone to the gas feeding space outside the gas homogenisation zone.

17. The gas feeding cup according to claim 13, wherein the gas mixing cone is arranged to the gas feeding space such that an apex of the gas mixing cone is furthest away from the cup bottom inner surface, and a gas flowing zone is provided between the gas mixing cone and the cup wall by arranging the gas mixing cone at a distance from the cup wall for providing a flowing path from the gas mixing zone to the gas feeding space outside the gas mixing zone.

18. The gas feeding cup according to claim 15, further comprising a gas mixing cone arranged to the gas feeding space, said gas mixing cone is disposed at a distance from the gas homogenisation surface for forming a gas mixing zone between the gas homogenisation surface and the gas mixing cone.

19. The gas feeding cup according to claim 18, wherein the gas mixing cone is arranged to the gas feeding space such that an apex of the gas mixing cone is furthest away from the gas homogenisation surface, and a gas flowing zone is disposed between the gas mixing cone and the cup wall by arranging the gas mixing cone at a distance from the cup wall for providing a flowing path from the gas mixing zone to the gas feeding space outside the gas mixing zone.

* * * * *